US 6,717,971 B2

(12) United States Patent
Marsh et al.

(10) Patent No.: US 6,717,971 B2
(45) Date of Patent: Apr. 6, 2004

(54) SEMICONDUCTOR LASERS

(75) Inventors: John Haig Marsh, Glasgow (GB); Craig James Hamilton, Renfrewshire (GB)

(73) Assignee: The University Court of The University of Glasgow (GB)

( * ) Notice: Subject to any disclaimer, the term of this patent is extended or adjusted under 35 U.S.C. 154(b) by 48 days.

(21) Appl. No.: 09/788,891

(22) Filed: Feb. 20, 2001

(65) Prior Publication Data

US 2002/0097762 A1 Jul. 25, 2002

(30) Foreign Application Priority Data

Jan. 23, 2001 (GB) ............................................. 0101641

(51) Int. Cl.[7] ................................................. H01S 5/00

(52) U.S. Cl. .............................. 372/50; 372/45; 372/46

(58) Field of Search ............................... 372/44–46, 50

(56) References Cited

U.S. PATENT DOCUMENTS

| | | |
|---|---|---|
| 4,282,494 A | 8/1981 | Yonezu et al. |
| 4,511,408 A | 4/1985 | Holonyak, Jr. |
| 4,585,491 A | 4/1986 | Burnham et al. |
| 4,594,603 A | 6/1986 | Holonyak, Jr. |
| 4,639,275 A | 1/1987 | Holonyak, Jr. |
| 4,727,556 A | 2/1988 | Burnham et al. |
| 4,845,216 A | 7/1989 | Taylor et al. |
| 4,845,727 A | 7/1989 | Murray |
| 4,857,971 A | 8/1989 | Burnham |
| 4,871,690 A | 10/1989 | Holonyak, Jr. et al. |
| 5,384,797 A | 1/1995 | Welch et al. |
| 6,052,397 A * | 4/2000 | Jeon et al. .................. 372/46 |

OTHER PUBLICATIONS

McIlvaney et al., "Far–field behaviour of 980 nm broad area lasers incorporating bandgap widened extended slab waveguides", Oct. 26, 1994, IEEE (1995).

Qian et al., "Three Band–gap QW Intermixing in InP/InGaAs/InGaAsP System for Monolithically Integrated Optical Switch", IEEE 1998, pp. 194–195.

Hamilton et al., "Bandgap tuning of visible laser material", Mar. 5, 1998, Electronics Letters, vol. 34, No. 7, pp. 665–666, Apr. 2, 1998.

Kowalski et al., "Fabrication of narrow InGaAs–InAlGaAs broad–area lasers using quantum well intermixed extended cavities", CLEO, Monday Morning, May 4, 1998, pp. 37–38.

Carpenter et al., "SIMS analysis of InGaAs/InAlGaAs wafers—Report No. SI/GLU/6725", Institute of Surface Science and Technology, Loughborough University, Apr. 27, 1998, 26 pgs.

Marsh et al., "Monolithic integration in III–V semiconductors via a universal damage enhanced quantum well intermixing technique", Part of the SPIE Conference on Materials Modification by Ion Irradiation, Quebec, Canada, Jul. 1998, SPIE vol. 3413, 9 pgs.

(List continued on next page.)

*Primary Examiner*—Paul Ip
*Assistant Examiner*—James Menefee
(74) *Attorney, Agent, or Firm*—Piper Rudnick LLP; Jefferson Perkins

(57) ABSTRACT

There is disclosed an improved semiconductor laser device (10;10a), eg a single mode index guided laser diode. The device (10;10a) comprises: an optical waveguide (15;15a); at least one electrical contact (20;20a) extending along part of a length of the waveguide (15;15a); and wherein the at least one electrical contact (20;20a) is shorter than the optical waveguide (15;15a). By this arrangement a part or parts of the waveguide (15;15a) are not electrically pumped, in use.

16 Claims, 3 Drawing Sheets-

OTHER PUBLICATIONS

Saher, Helmy A., "Micro Raman studies of disordering due to dielectric cap annealing in GaAs/AlGaAs heterostructures; A Progress Report", May 5, 1998, 23 pgs.

McDougall et al., "Monolithic Integration via a Universal Damage Enhanced Quantum–Well Intermixing Technique", IEEE Journal of Selected Topics in Quantum Electronics, vol. 4, No. 4, Jul./Aug. 1998.

Helmy et al., "Quantitative Model for the Kinetics of Compositional Intermixing in GaAs–AlGaAs Quantum--Confined Heterostructures", IEEE Journal of Selected Topics in Quantum Electronics, vol. 4, No. 4, pp. 653–660, Jul./Aug. 1998.

Ke et al., "The electronic structure and optical properties of intermixed GaAs/AlGaAs double quantum wells", Journal of Applied Physics, vol. 84, No. 5, pp. 2855–2857, Sep. 1, 1998.

Li et al., "Silica capping for Al 0.3Ga 0.7 As/GaAs and In0.2Ga0.8As/GaAs quantum well intermixing", Applied Physics Letters, vol. 73, No. 23, pp. 3393–3395, Dec. 7, 1998.

Helmy et al., "Control of silica cap properties by oxygen plasma treatment for single–cap selective impurity free vacancy disordering", Applied Physics Letters, vol. 74, No. 5, pp. 732–734, Feb. 1, 1999.

McDougall et al., "GaAs/AlGaAs waveguide pin photodiodes with non–absorbing input facets fabricated by quantum well intermixing", Electronics Letters, vol. 36, No. 8, pp. 749–750, Apr. 13, 2000.

Liu et al., "Fabrication of Monolithically Integrated Mach–Zender Asymmetric Interferometer Switch", IEEE 2000, pp. 412–414.

"A13764 Al–quat MQW structure: Intermixing PL shifts recorded for control sample sputtered on week 1 and annealed each week", 4 pgs. No date.

"Intermixing Process control meeting: Effect of change of control TC from edge to centre", 1 pg., Apr. 6, 2000.

Qui et al., "Monolithically Integrated Fabrication of 2x2 and 4x4 Crosspoint Switches Using Quantum Well Intermixing", pp. 415–418, IEEE 2000.

Ke et al., "Monolithically integrated distributed Bragg reflector lasers for 1.5 um operation with band gap shifted grating section", Optical Materials 14 (2000), pp. 193–196.

McDougall et al., "Harmonic modelocking at up to 440 GHz repetition rates in InGaAs–InAlGaAs quantum well lasers", Department of Electronics and Electrical Engineering, University of Glasgow No Date..

Kowalski et al., "Monolithic integration in InGaAs–InAlGaAs optoelectronic devices for 1.55 um emission by quantum well intermixing", Department of Electronics and Electrical Engineering, University of Glasgow, No Date.

Marsh et al., "Quantum well intermixing in materials systems for 1.5 um (invited)", J. Vac. Sci., Technol. A 16(2), pp. 810–816, Mar./Apr. 1998.

Camacho et al., "Laser structure for generating high optical power in a singlemode waveguide", Electronics Letters, vol. 34, No. 5, pp. 460–461, Mar. 5, 1998.

* cited by examiner

SEMICONDUCTOR LASERS

CROSS REFERENCE TO RELATED APPLICATIONS

This application is related to the Application "Improvements In Or Relating To Lasers", submitted on the same date of Feb. 20, 2001 Ser. No. 09/788,752. The disclosure of that application is fully incorporated by reference.

FIELD OF INVENTION

The present invention relates to semiconductor laser devices, and in particular, though not exclusively, to a single mode index guided laser diode.

BACKGROUND OF INVENTION

In many applications there is a desire for semiconductor laser devices to operate with a single spatial mode output. This output is desirable, for example, for increased coupling to single mode fibres, and for generating small spot sizes with high light intensities. Typically laser diodes generating single mode outputs use index guided laser structures which have either a ridge or a buried heterostructure waveguide. Such devices comprise, for instance as disclosed in EP 0 475 330, a laser structure comprising a substrate, lower and upper charge carrier confining layers on said substrate, a ridge extending over a portion of said upper confining layer and laterally confining the optical mode of said laser, whereby a layer of active lasing material is sandwiched between said confining layers, said layer comprising a Quantum Well structure and being configured as an active region.

Though these devices provide a single spatial mode output, the total output power is limited due to the Catastrophic Optical Mirror Damage (COMD) level at ends (facets) of the device. Each laser facet is cleaved semiconductor, and as such contains a high density of vacancies and broken bonds which can lead to the absorption of generated light. Light or electrical current absorbed at the laser facets generates heat as excited carriers recombine non-radiatively. This heat reduces the semiconductor band-gap energy, leading to an increase in absorption inducing thermal runaway which results in COMD.

Other problems with these devices include the propagation of higher order modes at high drive currents. These higher order modes propagate due to high levels of injected carriers influencing the refractive index and optical gain in areas immediately adjacent the active region.

It is an object of at least one embodiment of at least one aspect of the present invention to provide a laser device (such as a single mode index guided laser) which obviates or mitigates at least one of the aforementioned disadvantages of the prior art.

It is a further object of at least one embodiment of at least one aspect of the present invention to provide a semiconductor laser device, which, by use of a diffractive region at an end of a laser region (such as a single mode index confined semiconductor laser region), provide as single mode output at increased output power levels.

It is a still further object of at least one embodiment of at least one aspect of the present invention to provide a semiconductor laser device wherein, by incorporating a passive region formed by Quantum Well Intermixing using an impurity free technique in a gain region, beam steering characteristics of the laser device can be improved, ie by reducing the tendency to beam steer.

SUMMARY OF INVENTION

According to a first aspect of the present invention, there is provided a semiconductor laser device comprising:
  an optical waveguide;
  at least one electrical contact extending along part of a length of the waveguide; and wherein the at least one electrical contact is shorter than the optical waveguide.

Preferably, at least one end of the/each electrical contact is spaced from a respective end of the optical waveguide.

In one embodiment, the optical waveguide is a ridge waveguide, and the at least one electrical contact is provided on the ridge waveguide.

By this arrangement a part or parts of the ridge waveguide will not be electrically pumped, in use. It has been surprisingly found by this arrangement, that the semiconductor laser device may be operated as a mode control discriminator/stabiliser. Since the waveguide is single mode, the non pumped portion of the waveguide with no current injection should remain single mode, in use.

Preferably a length of the optical waveguide may be around 200 to 2000 µm, while a length/total length of the electrical contact(s) may be around 100 to 1900 µm.

In a modified embodiment there may be provided a first compositionally disordered or Quantum Well intermixed material bounding sides of the optical waveguide.

According to a second aspect of the present invention, there is provided a method of fabricating a semiconductor laser device comprising the steps of:
  (i) forming an optical waveguide;
  (ii) forming at least one electrical contact along part of a length of the waveguide, such that the at least one electrical contact is shorter than the optical waveguide.

According to a third aspect of the present invention there is provided a semiconductor laser device, comprising:
  an optical active region including an optical waveguide and an optically passive region(s) provided at one or more ends of the optical waveguide; wherein
  the at least one of the optically passive region(s) is broader than the optical waveguide so that, in use, an optical output of the optical waveguide diffracts upon traversing the at least one optically passive region.

In this way, the optical output may be expanded so that an intensity of optical radiation (light) impinging on an output facet of the device is reduced. Hence an output power of the device can be increased without reaching the COMD limit of the output facet.

Preferably the optically active and passive region(s) are provided within a core or guiding layer between first (lower) and second (upper) optical cladding/charge carrier confining layers, which guiding layer may comprise an active lasing material.

Preferably a ridge is formed in at least the second cladding layer and extends longitudinally from a first end of the device to a position between the first end and a second end of the device.

Additionally the active lasing material layer may include a Quantum Well (QW) structure.

Preferably the optically passive region(s) may comprise a first compositionally disordered or Quantum Well Intermixed (QWI) semiconductor (lasing) material region provided from or adjacent to the aforesaid position to the second end of the device.

In a modification of the device there may be provided second compositionally disordered (lasing) material regions laterally bounding the optical active region.

The first and second QWI materials may have a larger band-gap than the active region. The first and second compositionally disordered lasing materials may therefore have a lower optical absorption than the active region.

Preferably the device may be of a monolithic construction.

More preferably the device may include a substrate layer upon which may be provided the first cladding layer, core layer, and second cladding layer respectively.

Preferably the second end or facet may comprise an output of the semiconductor laser device. The first QWI material may therefore act as a diffractive region at the said output of the laser device. The diffractive region may act, in use, to reduce the intensity of optical radiation impinging on the said facet by spreading out the optical radiation.

More preferably the facet includes an anti-reflective coating on cleaved semiconductor. Preferably the anti-reflective coating may be around 1%–10% reflective. The combination of the first QWI diffractive region and the anti-reflective coating provides a Non-Absorbing Mirror (NAM) which further raises the COMD level of the facet and consequently the output power of the laser device can be raised.

Advantageously, the first and second compositionally disordered materials may be substantially the same.

The QWI washes out the Quantum Well confinement of the wells within the semiconductor laser material. More preferably, the QWI may be substantially impurity free. The QWI regions may be "blue-shifted", that is, typically greater than 20–30 meV, and more typically, a 100 meV or more difference exists between the optical active region when pumped with carriers and the QWI passive regions. The first compositionally disordered lasing material therefore acts as a spatial mode filter as higher order modes will experience greater diffraction losses as they propagate through the first compositionally disordered lasing material than the fundamental mode. Thus the fundamental mode will have a greater overlap with the active region and be selectively amplified. The semiconductor laser device may therefore be adapted to provide a substantially single mode output.

Preferably the semiconductor laser device further comprises respective layers of contact material contacting an (upper) surface of the ridge and a (lower) surface of the lower cladding layer. Alternatively and preferably, the contact material may contact an upper surface of the ridge and a lower surface of the substrate. The contact layers may provide for drive current to the optical active or "gain" region. It will be appreciated that references to "upper" and "lower" are used herein for ease of reference, and that in use, the device may be oriented in any of various dispositions.

In an embodiment of the present invention the material contacting an upper surface of the ridge may have a smaller area than the area of the upper surface of the ridge. In this embodiment a contact-free portion of the ridge exists. This contact-free portion may provide a second passive region within the core layer of the semiconductor laser device. The second passive region may have a larger band-gap energy and therefore lower absorption than the active region. The second passive region may be formed by Quantum Well Intermixing as hereinbefore described.

Preferably the second passive region may be part of the ridge. Preferably also an end of the second passive region is provided at the aforesaid position such that the second passive region is at an effective "output end" of the laser device. The second passive region may assist in correct beam steering.

Preferably, a length from the position to the second end of the device may be around three orders of magnitude smaller than a length between the first and second ends of the device. Preferably also the second passive region may be substantially smaller in length than the passive region, i.e. the distance between the aforesaid position and the second end of the device.

In an embodiment of the semiconductor laser device, the semiconductor laser device may have a ridge width of around 1 to 5 $\mu$m, a width of around at least three times that of the ridge, and preferably around 15 $\mu$m, a distance between the ends of around 1–2 mm, a distance between the first end and the position of around 1.5 mm, and a passive region having a length of around 0.5 mm.

Preferably the semiconductor laser device is fabricated in a III–V materials system such as Gallium Arsenide (GaAs) or as Aluminium Gallium Arsenide (AlGaAs), and may therefore lase at a wavelength of substantially between 600 and 1300 nm. The first and second compositionally disordered materials may substantially comprise Indium Gallium Arsenide (InGaAs). It will, however, be appreciated that other material systems may be employed, eg Indium Phosphide, (InP), and may therefore lase at a wavelength of substantially between 1200 and 1700 nm.

According to a fourth aspect of the present invention there is provided a method for fabricating a semiconductor laser device comprising the steps of:

(i) forming in order:
  a first optical cladding/charge carrier confining layer;
  a core (lasing material) layer, in which is formed a Quantum Well structure; and
  second optical cladding/charge carrier confining layer;

(ii) forming a passive region(s) in the lasing material layer; and (iii) forming a ridge from at least a portion of the second cladding layer.

Step (i) may be carried out by known growth techniques such as Molecular Beam Epitaxy (MBE) or Metal Organic Chemical Vapour Deposition (MOCVD).

Steps (ii) and (iii) may be interchanged, though it is preferred to carry out step (ii) then step (iii).

Preferably the passive region(s) may be formed by a Quantum Well Intermixing (QWI) technique which may preferably comprise generating vacancies in the passive region(s), or may alternatively comprise implanting or diffusing ions into the passive region(s), and annealing to create a compositionally disordered region(s) of the core layer, having a larger band-gap than the Quantum Well structure.

Preferably the QWI technique may be performed by generating impurity free vacancies, and more preferably may use a damage induced technique to achieve Quantum Well Intermixing. In a preferred implementation of such a technique, the method may include the steps of:

depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer. Such a technique is described in co-pending application entitled "Method of Manufacturing Optical Devices and Related Improvements" also by the present Applicant, and having the same filing date as the present application, the content of which is incorporated herein by reference.

Preferably in step (ii) the passive region may be formed by QWI into the region(s) to create a compositionally disordered region of the lasing material having a larger band-gap than the Quantum Well structure.

Preferably step (iii) may be achieved by known etching techniques, e.g. dry or wet etching.

Preferably a length of the passive region is shorter than a length of the device. This arrangement provides a passive region adjacent a gain region.

More preferably, at least part of the passive region may be broader than the ridge. The passive region therefore provides a diffractive region adjacent the ridge which confines an optical beam within the QW structure. Advantageously the ridge may not extend over the said passive region.

Preferably the method may include the step of initially providing a substrate onto which is grown the first cladding layer, core layer, and second cladding layer, respectively.

Preferably, step (ii) may be performed by generating impurity free vacancies, and more preferably may use a damage enhanced technique to achieve Quantum Well Intermixing.

Preferably, the method may include the step of applying electrical contact layers to a surface of the lower cladding layer and a surface of the ridge. Alternatively and preferably, electrical contact layers may respectively be applied to a lower surface of the substrate, and an upper surface of the ridge.

In an embodiment of the invention, one of the electrical contact layers may be applied to a portion of the ridge so that the semiconductor laser device has an active region, and at least one second passive region below, ie within the area of the ridge. Preferably the portion of the ridge may be adjacent a first end of the device, such that the second passive region is provided at or near an "output end" of the laser device.

BRIEF DESCRIPTION OF DRAWINGS

A number of embodiments of the present invention will now be described, by way of example only, with reference to the accompanying drawings, which are.

DETAILED DESCRIPTION OF DRAWINGS

Figure 1:
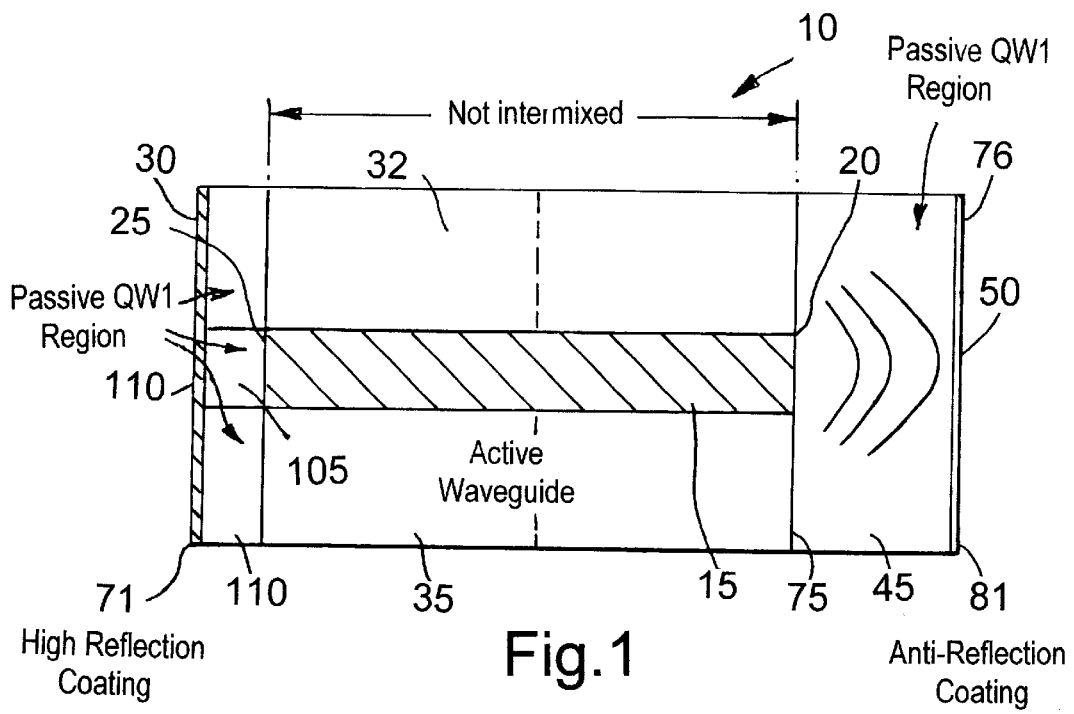
FIG. 1 align a plan view of a semiconductor laser device according to a first embodiment of the present invention.
Figure 2:
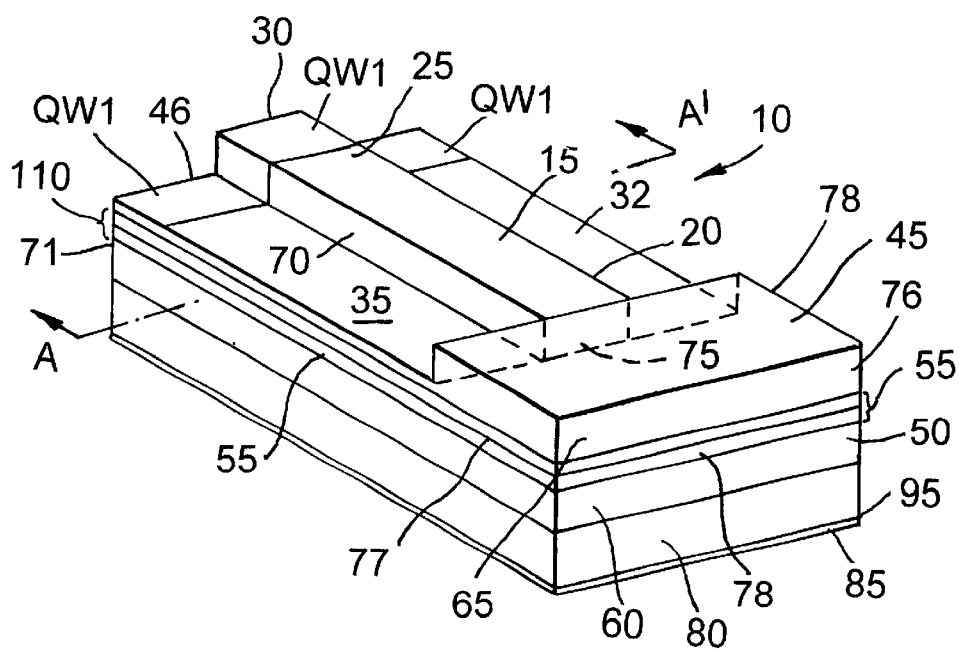
FIG. 2 a perspective view from one side to one end and above of the semiconductor laser device of FIG. 1.
Figure 3:
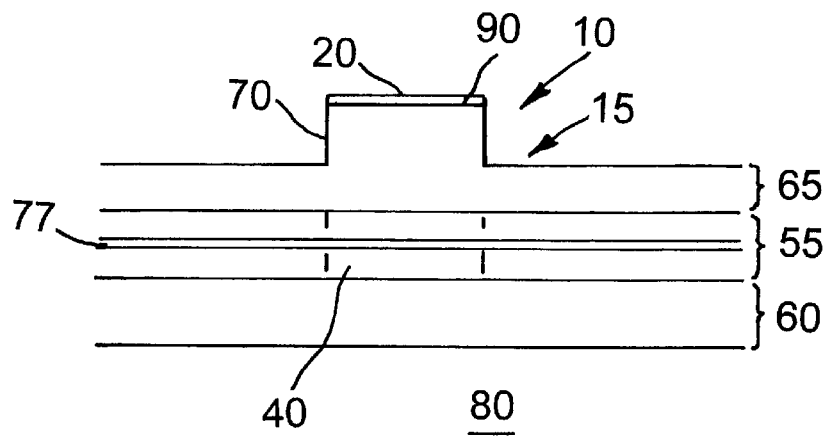
FIG. 3 a cross-sectional view of the device of FIG. 2 along line A—A.

Referring firstly to FIGS. 1 to 3, there is shown a semiconductor laser device, generally designated 10, according to a first embodiment of the present invention. The device 10 comprises: an optical waveguide 15; at least one electrical contact 20 extending along part of a length of the waveguide 15, and wherein the at least one electrical contact 20 is shorter than the optical waveguide 15.

One end 25 of the electrical contact 20 is spaced from a respective end 30 of the optical waveguide 15. In this embodiment, the optical waveguide 15 is a ridge waveguide, and the electrical contact 20 is provided along part of the ridge waveguide 15. By this arrangement a part or parts of the ridge waveguide 15 will not be electrically pumped in use.

A length of the optical waveguide 15 may be around 200 to 2000 $\mu$m, while a total length of the electrical contact 20 may be around 100 to 1900 $\mu$m.

In this embodiment, the part of the ridge waveguide 15 having contact 20, is laterally bounded by etched portions 32,35.

In a modified embodiment the etched portions 32,35 may comprise compositionally disordered or Quantum Well Intermixed portions bounding sides of the optical waveguide 15.

The device 10 further comprises:

an optical active or gain region 40 including optical waveguide 15, and an optically passive region 45 provided at an end of the optical waveguide 15; wherein the optically passive region 45 is broader than the optical waveguide 15 so that, in use, an optical output of the optical waveguide 15 diffracts as it traverses the optically passive region 45.

In this way, the optical output is expanded so that the intensity of light impinging on an output facet 50 of the device 10 is reduced, and hence an output power of the device 10 can be increased without reaching the COMD limit of the output facet 50.

The optically active and passive regions 40,45 are provided within an optical guiding or core layer 55 between first and second (lower and upper) optical cladding confining layers 60,65. The first cladding layer 60, guiding layer 55, and second cladding layer 65 may each have a refractive index of around 3.0 to 3.5, the guiding layer 55 having a higher refractive index than the cladding layers 60,65.

A ridge 70 is formed in at least the second cladding 65, and extends longitudinally from a first end 70 of the device 10 to a position 75 between the first end 70 and a second end 76 of the device 10.

The optical guiding layer 55 comprises an active lasing material layer including a Quantum Well structure 77.

The optically passive region 45 includes a compositionally disordered semiconductor material 78 provided within the guiding layer 55 from or adjacent to the aforesaid position 75 to the second end 76 of the device 10.

The compositionally disordered lasing material 78 has a larger band-gap than the guiding layer 55 with Quantum Well structure 77. The compositionally disordered lasing material 78 has a lower absorption than the active layer 55 without composition disorder.

As can be seen from FIGS. 1–3, the device 10 is of a monolithic construction including a substrate 80, upon which the other layers 60, 55, 65 are grown by conventional III–V semiconductor growth techniques, e.g. Molecular Beam Epitaxy (MBE) or Metal Organic Chemical Vapour Deposition (MOCVD).

The second end 76 output facet 50 comprises an output of the semiconductor laser device 10. The compositionally disordered lasing material 78 therefore acts as a diffractive region at the said output facet 50 of the laser device 10. The diffractive region acts, in use, to reduce the intensity of optical radiation (light), impinging on the said facet 50 by spreading out the optical radiation.

The facet 50 optically includes an anti-reflective coating 81 on cleaved semiconductor. The anti-reflective coating 81 may be around 1%–10% reflective. The combination of the diffractive passive region 45, and the anti-reflective coating 81 provides a Non-Absorbing Mirror (NAM) which further raises the COMD level of the facet 50, and consequently the output power of the laser device 10 can be raised.

The compositionally disordered lasing material 78 may be achieved through Quantum Well Intermixing (QWI), as will be described in greater detail hereinafter. The QWI washes out the Quantum Well confinement of the wells 77 within the guiding layer 55, ie semiconductor laser material. More preferably, the QWI may be substantially impurity free. The QWI passive region 45 is "blue shifted", that is, typically 100 meV or more difference exists between the optical gain region 40 when pumped with carriers and the QWI passive region 45. The compositionally disordered lasing material 78 therefore acts as a spatial mode filter as higher order modes will experience greater diffraction losses as they propagate through the compositionally disordered lasing material 78 than the fundamental mode. Thus the fundamental mode will have a greater overlap with the active region 40 and be selectively amplified. The semiconductor laser device 10 can therefore be adapted to provide a substantially single mode output.

The semiconductor laser device 10 further comprises respective layers of metallic contact material 20,85 contacting an upper surface 90 of the ridge 70, and a lower surface 95 of the substrate 80. The contact layers 20,85 provide for drive current to the optical gain region 40. It will be appreciated that references to "upper" and "lower" are used for ease of reference and that, in use, the device 10 may be oriented in any of various dispositions. The contact 20 material contacting the upper surface 90 of the ridge 70 has a smaller area than a total area of the upper surface 90 of the ridge 70. In this embodiment, a contact-free portion 105 of the ridge 70 exists. This contact-free portion 105 provides a further passive region 110 at an end of the optically active region 40 of the semiconductor laser device 10. The second passive region 105 has a larger band-gap energy and lower absorption than the optically active or gain region 40. The further passive region 10 may be formed by QWI. As can be seen from FIG. 1, the further passive region 105 is as laterally extensive as the ridge 70.

In a preferred arrangement, a length from the position 75 to the second end 76 of the device 10, is around three orders of magnitude smaller than a length between the first end 71 and the second end 76 of the device 10.

In such an embodiment of the semiconductor laser device 10, the semiconductor laser device 10 has a ridge width of around 1 to 5 μm, a width of around at least 15 μm, a distance between the ends 71,76 of around 1–2 mm, a distance between the first end 71 and the position 75 of around 1.5 mm, and a passive region 45 having a length of around 0.5 mm.

The semiconductor laser device is in the embodiment fabricated in a Gallium Arsenide (GaAs) materials system such as Aluminium Gallium Arsenide (AlGaAs) material system, and may therefore lase at a wavelength of between 600 and 1300 nm, and preferably around 980 nm. The guiding layer 55 may substantially comprise in Indium Gallium Arsenide (InGaAs). Alternatively, the device 10 may be fabricated in an Indium Phosphide (InP) materials system, eg operating in a wavelength range of 1200 to 1700 nm.

A method for fabricating the semiconductor laser device 10 comprises the steps of:
forming in order:
the first optical cladding charge carrier confining layer 60 on substrate 80;
guiding (lasing material) layer 55 in which is formed Quantum Well structure 60; and
second optical cladding confining layer 65;
(ii) forming passive region 45 in the lasing material layer 55; and (iii) forming ridge 70 from at least a portion of the upper cladding layer 65.

Steps (ii) and (iii) may be interchanged.

In this embodiment, the passive region 45 is formed by a Quantum Well Intermixing (QWI) technique which comprises generating vacancies in the passive region 45, or may alternatively comprise implanting or diffusing ions into the passive region 45, and annealing to create compositionally disordered regions of the guiding layer having a larger band-gap than the Quantum Well structure 77.

The QWI technique is performed by generating impurity free vacancies and advantageously uses a damage induced technique to achieve Quantum Well Intermixing. The technique requires depositing by use of a diode sputterer, and within a substantially Argon atmosphere, a dielectric layer such as Silica ($SiO_2$) on at least part of a surface of the semiconductor layer device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer.

The method of fabricating the device 10 of this first embodiment may also comprise or include steps hereinafter described with reference to a method of fabrication of a second embodiment of the device.

In step (ii) the passive region 45 is advantageously form by QWI into the region 45 to create the compositionally disordered region 78 of the lasing material layer 55 having a larger band-gap and lower absorption than the Quantum Well structure 60.

Step (iii) may be achieved by known etching, eg wet or dry etching.

As can be seen from FIGS. 1 to 3, a length of the passive region 45 is in this embodiment shorter than a length of the device 10. This arrangement provides a passive region 45 adjacent optical gain region 40.

As can be seen from FIG. 2, at least part of the passive region 45 is broader than the ridge 75. The passive region 45 therefore provides a diffractive region adjacent the ridge 75 which confines an optical beam within the QW structure 60. The ridge 70 does not in this embodiment extend over the said passive region 45.

The fabrication method includes the step of applying the contact layers 85,20 to the lower surface 95 of the substrate 80 and to an upper surface 90 of the ridge 75. The contact layer 80 is applied to a portion of the ridge 70 so that the semiconductor laser device 10 has an active region 40, and at least one second passive region 110 below the ridge 75. The portion of the ridge 70 is adjacent an end of the device 10, such that the second passive region 110 is provided at or near a first end 71 of the laser device 10. The second passive region 110 may be formed by a QWI technique in a similar manner to the passive region 45.

Illustrated in FIG. 1 are coatings 71,81 which form a back reflector and an output coupler of the semiconductor laser device 10, respectively. The coatings 71,81 at least partly cover the first and the second ends 70,76 of the device 10. Coating 71 is a high reflection coating, ie typically >90% which together with optically passive QWI region 110 provides a Non-Absorbing Mirror (NAM). Optically passive region 110 is positioned at the output of the gain region 40 and acts as a diffractive region. The diffractive region reduces the intensity of optical radiation (light) impinging on the second end 76 by spreading out the optical radiation. Anti-reflection coating 81 reflects a percentage of optical radiation of between 1% and 10% back into the laser device 10, while transmitting the remaining optical radiation as the laser device output.

The compositionally disordered lasing material regions 45, 78, 110 are achieved through Quantum Well Intermixing (QWI) as described hereinafter. The QWI washes out the Quantum Well confinement of the wells within the semiconductor lasing material layer or guiding layer 55. The QWI is in this embodiment impurity free and "blue-shifted", that is, typically greater than 20 to 30 meV, and more typically greater than around 100 meV or more difference exists between the optical active region 40, when pumped with carriers and the QWI passive regions 45,110. The passive region 45 acts as a spatial mode filter as higher order modes will experience greater diffraction losses as they propagate through the region 45 than the fundamental mode. Thus the fundamental mode will have a greater overlap with the gain region 40 and be selectively amplified. The semiconductor laser device 10 therefore favours a single mode output.

Figure 4:
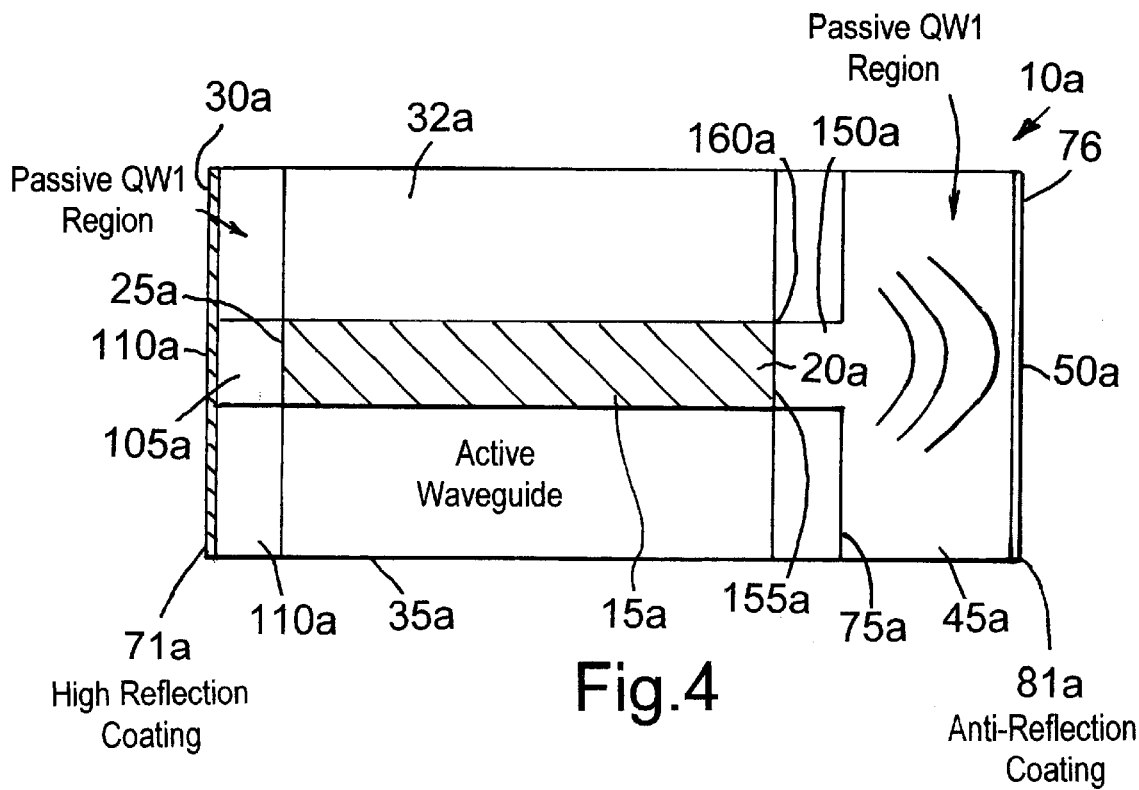
FIG. 4 a plan view of a semiconductor laser device according to a second embodiment of the present invention.
Figure 5:
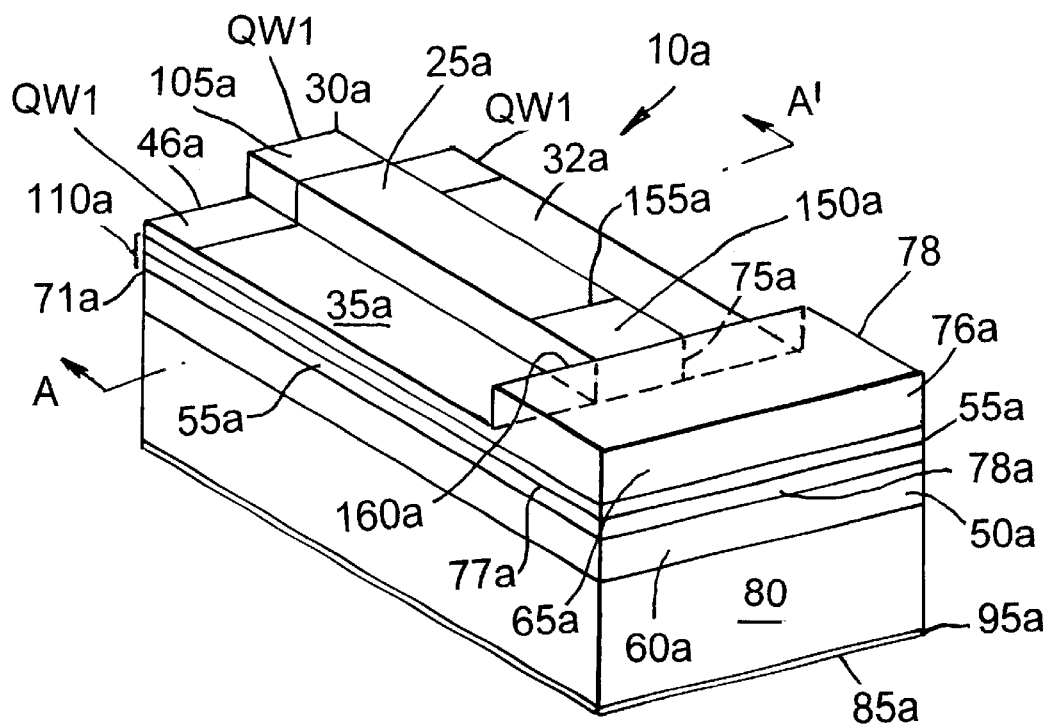
FIG. 5 a perspective view from one side to one end and above of the semiconductor laser device of FIG. 4.
Figure 6:
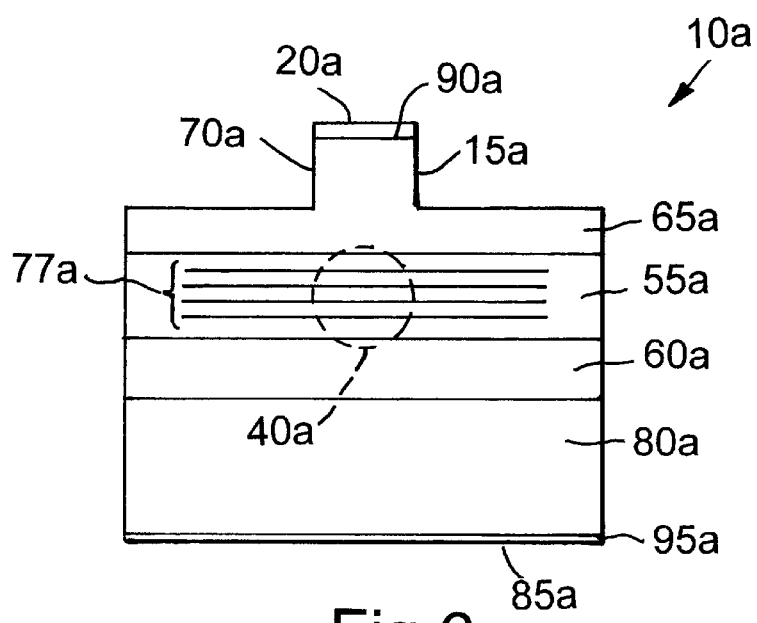
FIG. 6 a cross-sectional view of the device of FIG. 5 along line A–A'.

Referring now to FIGS. 4–6, there is illustrated a semiconductor laser device, generally designated 10a, according to a second embodiment of the present invention. Like parts of the device 10a are indicated by like numerals to the device 10 of the first embodiment but suffixed "a".

A difference between the second device 10a and first device 10, is that in the device 10a a yet further QWI passive region 150a is provided under ridge 70a, and between an end 155a of the contact 20a and the position 75a, that is to say, the contact 20a stops short of the position 75a. As can be seen from FIG. 4, the further passive region 150a is in this embodiment substantially smaller in length than the passive region 45.

An end 160a of the yet further passive region 150a is provided at the position 75a such that the yet further region 150a may, in use, assist in preventing output beam steering. The region 150a acts as a spatial mode filter that is more discriminatory than the diffractive passive region 45a. That is to say since the waveguide 15a will be designed to be single moded, the further passive region 150a will remain single mode, in use, as it is not injected with current.

When operated, contact free further passive region 150a has no substantially non-linear effects due to input carriers, so avoiding steering the output beam as electrical drive current is varied, thus correcting for beam steering. A similar arrangement exists at the first end 71a of the device 10a where a NAM operates.

This embodiment also has the advantages attributed to the diffractive passive region 45 as hereinbefore described with reference to the first embodiment.

With reference particularly to FIG. 6, a method will now be described for fabrication of the semiconductor laser device 10a at least parts of which also apply to the device 10 of the first embodiment.

The method begins with provision of substrate 80a. The substrate 80a may be Gallium Arsenide (GaAs) and may be highly n-type doped. Grown on the substrate 80a is the first optical cladding/charge carrier confining layer 60a. First charge carrier confining layer 60a may comprise Aluminium Gallium Arsenide (AlGaAs) and may be n-type doped to a first concentration. This first cladding layer 60a, eg having a refractive index of around 3.0 to 3.5 is typically 1 to 3 μm thick. Grown on the first cladding layer 60a, is the optical active guiding core semiconductor lasing material layer 55a. This layer 55a also comprises AlGaAs. Layer 55a is substantially intrinsic. The active layer 55a, eg having a refractive index of around 3.0 to 3.5, is grown to be a few hundred nm thick typically. Within the layer 55a is provided Quantum Well structure 77a.

On the layer 55a is grown the second cladding layer 65a. The second cladding layer 65a is p-type with a substantially equal doping concentration to the lower cladding layer concentration. The second cladding layer 65a is also made of AlGaAs with a thickness, composition and refractive index similar to that of the first cladding layer 60a. Thus the Quantum Well (QW) structure 77a is sandwiched between n-type and p-type layers first and second cladding layers 60a, 65a respectively. Active layer 55a has a lower Aluminium (Al) content than cladding layers 60a, 65a. The active layer 55a has a higher refractive index than the cladding layers 60a, 65a.

A selective QWI mask (not shown) is then placed over portions of the device 10a which are not to be QWI. The technique preferably used to create Quantum Well Intermixing in and around the Quantum Well structure 77a in this embodiment is a damage induced technique using vacancies. However, it will be understood that any other Quantum Well Intermixing technique which achieves a difference in the band-gap energy between the Quantum Well structure 77a and the Quantum Well intermixed passive regions 45a, 105a could be used within the scope of this invention. The preferred damage induced technique requires a sputtered silicon oxide ($SiO_2$) cap to be deposited upon the device 10a. Following a thin layer of $SiO_2$ being deposited, the device may be subsequently heated to an elevated (high) temperature to anneal it.

Once the device 10a has been annealed, portions of the second cladding layer 65a on either side of where the ridge 70a is to be defined are etched away by known etching techniques once a suitable etch mask has been placed over the area defining the ridge 70a.

Metal contacts 20a, 85a may then be deposited by known lithographic techniques or ridge 70a and subsequent 80a, respectively, so as to allow for electrical driving of the device 10a.

Thus the device 10a shown in cross-section in FIG. 5 is of a monolithic semiconductor laser device structure. The active or gain portion 40a of the laser device 10a is within the layer 55a and confined in the Quantum Well structure 77a by the ridge 70 above. The QW intermixed regions 45a, 110a, 150a around the Quantum Well structure 77a are arranged as described hereinbefore.

By varying the size of the QWI mask and by carrying out QWI more than once on the device 10a, multiple QWI passive regions 45a, 110a, 150a can be created. Additionally the QWI mask may only provide for QWI intermixing in the diffractive passive region 45a, thus creating a device 10a wherein the waveguide 15a is defined by only the ridge 70a above.

Both embodiments hereinbefore described, include a portion 45, 45a in the layer 55, 55a, which is diffractive as it is passive and extends across the breadth of the device 10, 10a. Thus the semiconductor laser device 10, 10a has a diffractive region 45, 45a at the end of a single mode index combined semiconductor waveguide laser. The diffraction region 45, 45a is effectively a passive slab waveguide region where optical radiation is allowed to diffract.

The diffractive region 45, 45a effectively lowers the intensity of light on the output end 81, 81a without reducing the output power or brightness of the device 10, 10a, since the diffraction angle is controlled by the relative refractive index differences between ridge waveguide 70, 70a and other regions of the device 10, 10a. The passive slab waveguide diffractive region 45, 45a can also be used as a spatial mode filter because they are essentially diffractive regions within the laser cavity. This has an advantage that higher order waveguide modes will experience greater diffraction losses than the fundamental mode as they propagate across the diffractive region 45, 45a. The fundamental mode will then have a greater overlap of the gain region 40 and be selectively amplified. Thus for the present invention it is advantageous that the diffractive region 45, 45a has a larger band-gap energy than the optically active region 40, 40a of the device 10, 10a.

Impurity free intermixing is advantageously used in the present invention as this creates an increase in the band-gap energy without adding optical losses through the addition of impurities.

A further advantage of the present invention is that the passive Quantum Well Intermixed region at the device output diffracts optical radiation leaving the gain region. The increased beam size at the ends of the device 10, 10a increases the COMD level at each facet and consequently higher output powers are attainable. Careful selection of the refractive index variations keeps the mode of the output beam as the fundamental with a horizontal divergence comparable to devices without a diffractive region.

A further advantage of the present invention is that high drive currents can be used between the contacts 20, 85; 20a, 85a without the risk of higher order modes propagating. It is known that as the drive current in semiconductor laser devices is increased, nonlinearities occur in the refractive index of portions around the gain region. A change in the refractive index allows higher order modes to be supported as the "kink-current" is reached. The present invention obviates this as these higher order modes experience larger divergence angles within the QWI regions. Further, beam steering and extra mode discrimination is gained from the further passive region 150a.

It will be understood by those skilled in the art that modifications may be made to the present invention without departing from the scope thereof.

It should particularly be appreciated that an advantage of embodiments of the present invention provided with an electrical contact(s) shorter than the waveguide is that a portion(s) of the waveguide without the electrical contact(s) remain single moded, in use, as it/they have no current injected therein.

A modification to the disclosed embodiment would be to employ a buried hetrostructure waveguide in place of the ridge disclosed.

What is claimed is:

1. A semiconductor laser device comprising:
    a substrate, a first cladding layer formed on the substrate, a core or guiding layer comprising active lasing material and formed on the first cladding layer, a second cladding layer formed on the core or guiding layer;
    an index-confined optical waveguide having a width, providing lateral optical confinement and extending longitudinally from a first end of the device to a second position between the first end and a second end of the device;
    an optically active region disposed in the core or guiding layer beneath and/or within the waveguide and extending longitudinally to a third position between the first end of the device and the second position, an electrical contact disposed above the waveguide and extending longitudinally to have an end at the third position;
    a first optically passive region of the core or guiding layer extending from the second position to the second end of the device, a width of the first optically passive region being broader than the width of the waveguide such that, in use, an optical output from the waveguide diffracts upon traversing the first optically passive region; and
    a second optically passive region within the core or guiding layer of the device longitudinally extending from the third position to the second position and having said width of the waveguide, the waveguide from the third position to the second position being contact-free.

2. A semiconductor laser device as claimed in claim 1, wherein a ridge is formed in at least the second cladding layer and extends longitudinally from the first end of the device to the second position between the first end and the second end of the device.

3. A semiconductor laser device as claimed in claim 2, wherein the second optically passive region is part of the ridge.

4. A semiconductor laser device as claimed in claim 2, wherein a length from the second position to the second end of the device is around three orders of magnitude smaller than a length between the first and second ends of the device.

5. A semiconductor laser device as claimed in claim 1, wherein the core or guiding layer includes a Quantum Well (QW) structure.

6. A semiconductor laser device as claimed in claim 1, wherein the first optically passive region comprises a first compositionally disordered or Quantum Well Intermixed (QWI) region provided from the second position to the second end of the device.

7. A semiconductor laser device as claimed in claim 6, and further comprising second compositionally disordered or QWI regions laterally bounding the optical active region.

8. A semiconductor laser device as claimed in claim 7, wherein the first and second compositionally disordered or QWI regions have substantially the same bandgap.

9. A semiconductor laser device as claimed in claim 6, wherein the semiconductor laser device has a ridge width of around 1 to 5 $\mu$m, a device width of at least three times that of the ridge, a distance between the first and second device ends of around 1–2 mm, a distance between the first end of the device and the second position of around 1.5 mm, the first optically passive region having a length of around 0.5 mm.

10. A semiconductor laser device as claimed in claim 1, wherein the device is of a monolithic construction.

11. A semiconductor laser device as claimed in claim 1, wherein the second end of the device comprises an output of the semiconductor laser device, the first optically passive region including a compositionally disordered or QWI region which acts, in use, as a diffractive region at the said output of the laser device, so as to reduce an intensity of optical radiation impinging on a facet of said second end of the device by spreading out the optical radiation.

12. A semiconductor laser device as claimed in claim 11, wherein the facet includes an anti-reflective coating on cleaved semiconductor.

13. A semiconductor laser device as claimed in claim 1, wherein the semiconductor laser device is fabricated in a III–V semiconductor materials system.

14. A semiconductor laser device as claimed in claim 13, wherein the III–V semiconductor materials system is a Gallium Arsenide (GaAs) based system lasing at a wavelength of substantially between 600 and 1300 nm.

15. A semiconductor laser device as claimed in claim 14, wherein the first optically passive region includes a first compositionally disordered region, sides of the optical waveguide between first and second ends thereof being bounded by second compositionally disordered regions, the first and second compositionally disordered regions comprising Indium Gallium Arsenide (InGaAs).

16. A semiconductor laser device as claimed in claim 13, wherein the III–V semiconductor materials system is an Indium Phosphide (InP) based system lasing at a wavelength of substantially between 1200 and 1700 nm.

* * * * *